US006714714B1

(12) United States Patent
Dee

(10) Patent No.: US 6,714,714 B1
(45) Date of Patent: Mar. 30, 2004

(54) BUTTERFLY PACKAGE PALLET

(75) Inventor: Richard Dee, Acton, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 09/754,664

(22) Filed: Jan. 4, 2001

(51) Int. Cl.[7] .......................... G02B 6/00; G01R 31/02; B23Q 1/25

(52) U.S. Cl. .......................... 385/135; 324/758; 269/55

(58) Field of Search ................................ 385/135, 134, 385/136, 137, 14; 324/758, 755, 753; 269/55, 56

(56) References Cited

U.S. PATENT DOCUMENTS 5,416,429 A * 5/1995 McQuade et al. ......... 324/72.5
5,589,781 A * 12/1996 Higgins et al. ............. 324/755
6,218,849 B1 * 4/2001 Kiyokawa ................... 324/755
6,272,276 B1 * 8/2001 Potteiger et al. ............ 385/134
6,297,654 B1 * 10/2001 Barabi ........................ 324/755
2001/0029874 A1 * 10/2001 Muirhead ................ 108/57.25

* cited by examiner

*Primary Examiner*—Chandrika Prasad
(74) *Attorney, Agent, or Firm*—J. Grant Houston

(57) ABSTRACT

A manufacturing pallet 100 has provisions for supporting an opto-electronic package 10 on a frame 112. Openings 110A, 110B are provided through the frame to enable mechanical access to the opto-electronic package from below the frame. Additionally, lead access openings 114A, 114B are provided to enable electrical access to the leads 12 of the package 10. As a result, the opto-electronic package need not be manipulated. Instead, the package can be carried on the frame, which is then installed directly on top of a given machine. The machine mechanically engages the package via the openings.

15 Claims, 4 Drawing Sheets

BUTTERFLY PACKAGE PALLET

BACKGROUND OF THE INVENTION

Hermetic packages are used in fiber optic systems to protect opto-electronic components from the environment. During manufacturing, the opto-electronic components are typically installed on a bench or submount, which is installed within the package. Optical fiber is typically inserted through a fiber feedthrough and secured onto the submount relative to the opto-electronic components. Preliminary testing may be performed in which the components are energized or their responses sampled to ensure that the opto-electronics are operating properly. Moreover, it may be necessary to energize active components or sample the responses of detectors as part of active alignment processes.

Once the manufacturing steps have been completed and the opto-electronic circuit is configured, the package is typically hermetically sealed in a lid sealing operation. Further, the ferrules around the optical fibers are further sealed.

Typically, in the manufacturing lines, the fiber optic systems are transported on multi-package trays. These trays typically have stops that prevent the packages from sliding during transportation between manufacturing steps.

SUMMARY OF THE INVENTION

One problem associated with these conventional tray systems surrounds the fact that many manufacturing steps are required to complete the fiber optic system. Further, the package must be transported numerous times between various machines. With each manufacturing step, the opto-electronic package must be manually removed from the tray and installed on a machine or other fixture for the associated manufacturing step.

The present invention is directed to pallet. It has provisions for supporting an opto-electronic package on a frame. Punched openings are provided through the frame to enable mechanical access to the opto-electronic package from below the frame. As a result, the opto-electronic package need not be directly manipulated by an operator. Instead, the package can be carried on the pallet, which is then installed directly on top of a given machine. The machine mechanically engages the package via the punched openings.

In general, according to one aspect, the invention features an opto-electronic package pallet. It comprises a frame having a punched opening for enabling mechanical access from below the frame to an opto-electronic package supported by the frame. In one embodiment, non-conductive shoulders are connected to the frame for supporting the opto-electronic package above the frame.

According to a preferred implementation, a fiber reel is also provided on the frame for holding a coil or length of optical fiber. Such fiber, typically in the form of a fiber pigtail, is typically inserted into the package, through a feed through, and connected to a submount or bench within the package as part of the manufacturing process.

According to further aspects of the preferred embodiment, a lead access punched opening is also provided in the pallet for enabling electrical connections to electrical leads of the opto-electronic package from below the frame. Typically, two lead access openings are provided for enabling access to two sets of butterfly electrical leads on the package.

According to another aspect of the preferred embodiment, standoffs are also provided to enable stacking of the pallets, one on top of the other. To enable a secure inter-pallet connection, standoff engagement slots are also preferably provided in each pallet.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
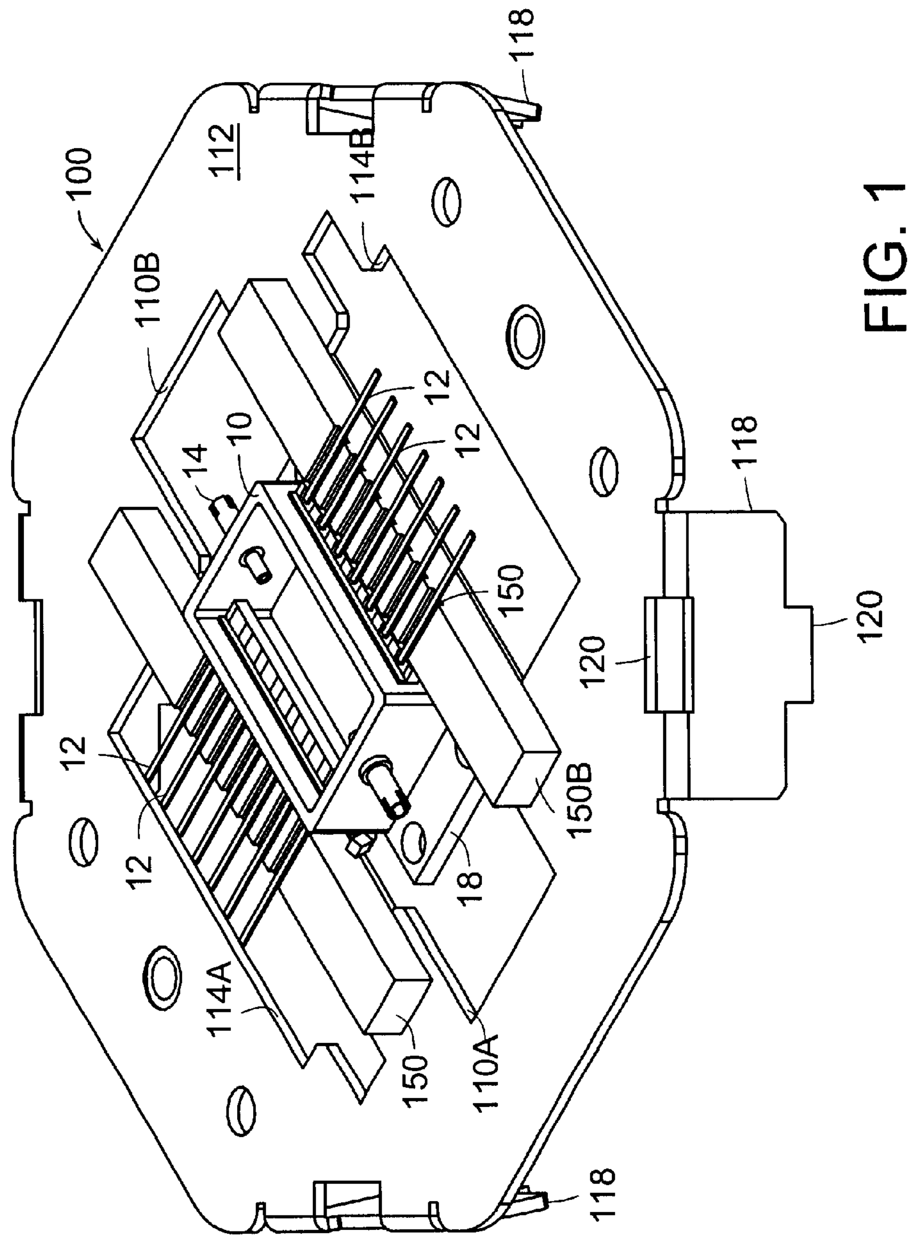
FIG. 1 is a perspective view of a pallet holding an opto-electronic package, according to the present invention.

FIG. 1 shows a butterfly package pallet, which has been constructed according to the principles of the present invention.

Generally, the pallet 100 is shown holding an opto-electronic package 10. In the specific illustrated embodiment, the opto-electronic package 10 is a butterfly package with electrical leads 12 extending from the package sidewalls, on either side of the package.

In the illustrated package, fiber ferrules 14 are also provided in fiber feedthroughs to accommodate passage of a fiber pigtail end into the package. Typically, the end of the pigtail is attached down onto a submount or bench that is to be installed within the package prior to a lid sealing operation.

The package further has a base 18. Typically, this base is used for mechanically securing the package 10 into a printed circuit board or other mechanical support during its final installation.

The pallet 100 comprises a frame portion 112. In the present embodiment, the frame portion 112 is manufactured from a stainless steel stamped sheet. The specific illustrated embodiment has an octagonal shape. This allows for the dense packing of the pallets 100, next to each other.

According to the invention, a mechanical access opening 110A, 110B is formed in the frame 100. This allows the package to be mechanically engaged or grabbed from below the frame.

Further, according to the preferred embodiment, lead access openings 114A are also provided in the frame 112. These allow electrical access to the leads 12 of the package 10, preferably from below the pallet 100 during manufacturing operations.

A mechanism is also preferably provided for stacking successive pallets, one on top of each other. In the illustrated embodiment, standoffs 118 are provided. These standoffs 118 have engagement tongues 120. When stacked, the engagement tongues mate with the standoff slots 122 of an adjoining pallet 100.

In one embodiment, two shoulders 150A, 150B, manufactured preferably from a non-conducting material such as a resin or ceramic, are attached, such as bonded, to the top surface of the pallet 112. The leads 12 of the package 10 rest on these shoulders, preferably in slots 152 so that the package is held above the top plane of the frame 112. This helps to protect the electronic components from damage from electrostatic discharge.

Figure 2:
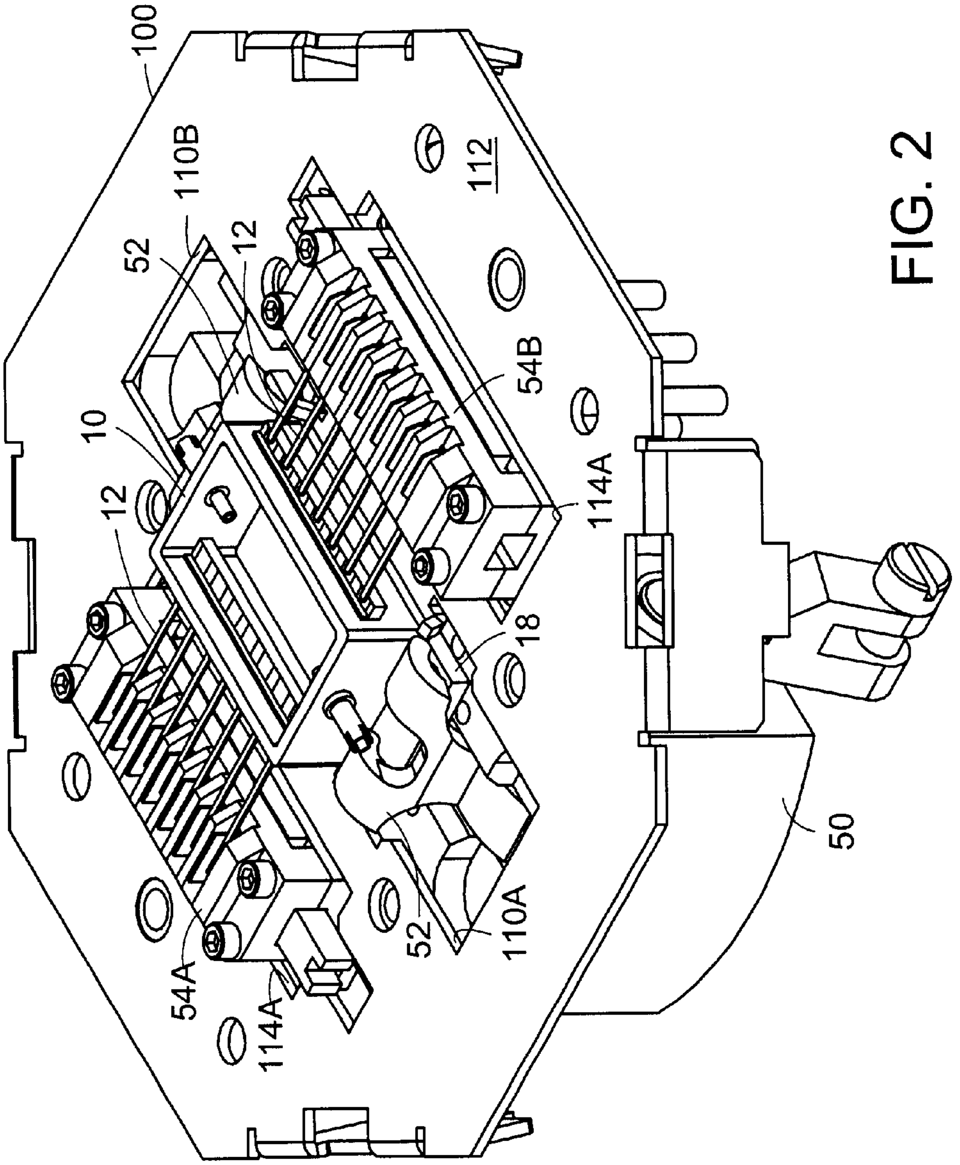
FIG. 2 shows a pallet with an opto-electronic package, which has been installed on a machine, illustrating the mechanical access to the package that is allowed by the pallet.

FIG. 2 shows a pallet 100 holding an opto-electronic package 10, which has been installed on a manufacturing machine chuck 50. Typically, clamp members 52 of the chuck 50 project or extend up through the both sides 110A, 110B of the access opening to engage the support base 18 of the package 10.

Further, according to the preferred implementation, lead contact arrays 54A, 54B extend through the lead access openings 114A, 114B to mechanically and electrically engage the leads 12 of the package 10.

As a result, according to the preferred embodiment, after installation on a machine chuck 50, the package 10 is mechanically attached to the chuck with clamps while the leads 12 of the package are engaged by the lead contact arrays 54A, 54B, allowing energization of the active devices within the package or sampling of responses from detectors, for example.

Figure 3:
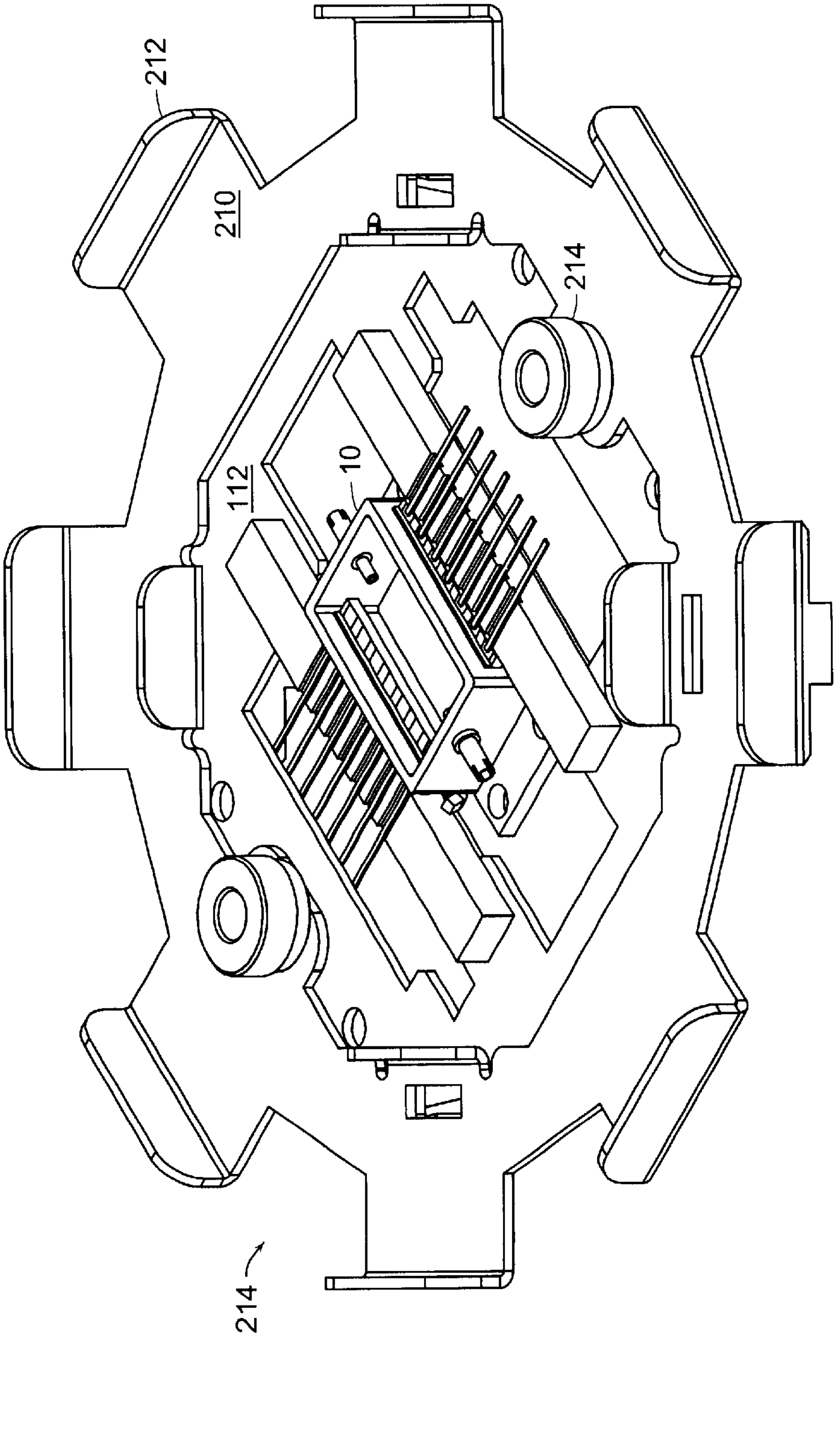
FIG. 3 is a perspective view of a pallet, with an opto-electronic package and a fiber reel for holding a coil or length of optical fiber.

FIG. 3 shows a pallet 100 in which a fiber reel 210 has been attached to the frame 112. Specifically, the reel 210 is generally circular with lip portions 212 extending upward from the reel to hold a coiled length of optical fiber extending around an inner periphery of the lip portions 212. This allows for the containment of the fiber pigtail in proximity to the package 10 during a pigtailing operation, and thereafter. Further, the slot regions 214 are provided between the lips 212 of the reel 210 allow for the manipulation of the fiber pigtail for insertion into or removal from the reel.

Figure 4:
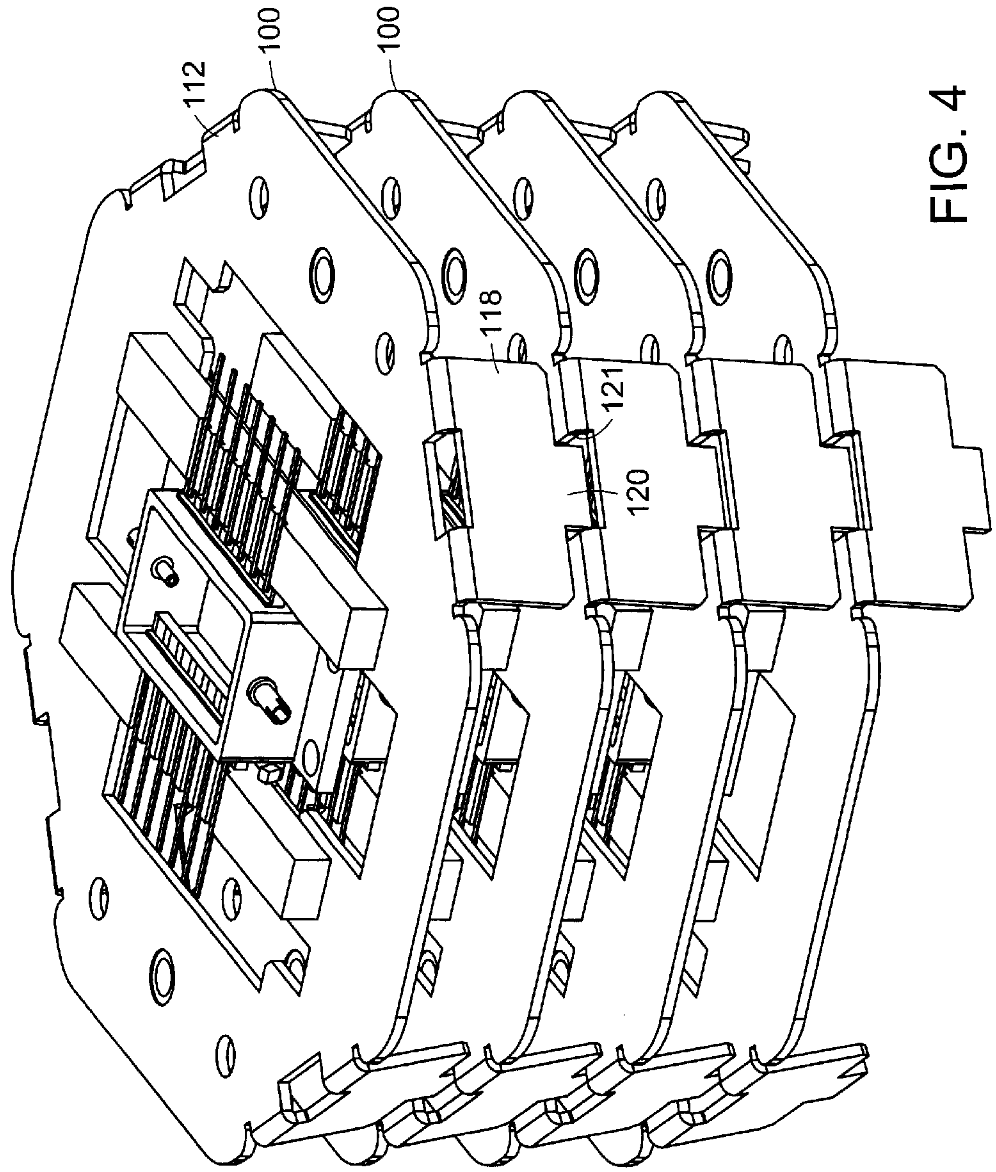
FIG. 4 is a perspective view showing multiple, stacked pallets, each holding a respective opto-electronic package.

Finally, FIG. 4 is a perspective view of multiple pallets 100 stacked one on top of each other. In each case, the standoffs 118 extend downward from the respective package frame 112 so that the engagement tongues 120 mate with the standoff slots 122 of an adjoining pallet 100.

While this invention has been particularly shown and described with references to preferred embodiments thereof, it will be understood by those skilled in the art that various changes in form and details may be made therein without departing from the scope of the invention encompassed by the appended claims.

What is claimed is:

1. An opto-electronic package manipulation system, comprising:

- a pallet including a frame having an opening enabling electrical access to electrical leads of an opto-electronic package on the pallet; and
- a chuck having lead contacts extending through the opening to engage the electrical leads of the package.

2. An opto-electronic package manipulation system as claimed in claim 1, further comprising non-conductive shoulders connected to the frame for supporting the opto-electronic package above the frame.

3. An opto-electronic package manipulation system as claimed in claim 1, further comprising a fiber reel on the frame for holding a coiled length of optical fiber.

4. An opto-electronic package manipulation system as claimed in claim 1, further comprising a fiber reel connected to the frame for holding a coiled length of optical fiber.

5. An opto-electronic package manipulation system as claimed in claim 1, further comprising two lead access openings for enabling electrical connections to the electrical leads of the opto-electronic package from below the frame.

6. An opto-electronic package manipulation system as claimed in claim 1, further comprising standoffs for engaging another pallet to enable stacking of multiple pallets on top of each other.

7. An opto-electronic package manipulation system as claimed in claim 1, wherein the frame comprises standoffs for engaging another pallet to enable stacking of multiple pallets on top of each other.

8. An opto-electronic package manipulation system as claimed in claim 7, wherein the frame comprises standoff engagement slots that are engaged by standoffs of another pallet.

9. An opto-electronic package manipulation system as claimed in claim 1, wherein the lead contacts extend upward through the opening to engage the electrical leads from below.

10. An opto-electronic package manipulation system, comprising:

- a pallet including a frame having at least one opening enabling electrical access to electrical leads of an opto-electronic package supported by the pallet and mechanical access to the opto-electronic package;
- a chuck comprising lead contacts extending through the at least one opening to engage the electrical leads of the package and at least one clamp member extending through the at least one opening to secure the package to the chuck.

11. An opto-electronic package manipulation system as claimed in claim 10, wherein the lead contacts and the at least one clamp member extend upward through the at least one opening to engage the electrical leads and the package, respectively, from below.

12. An opt(electronic package manipulation system as claimed in claim 10, wherein the at least one clamp member engages a base of the package.

13. An opto-electronic package manipulation system as claimed in claim 10, further comprising a fiber reel on the frame for holding a coiled length of optical fiber.

14. An opto-electronic package manipulation system as claimed in claim 10, further comprising two lead access openings for enabling electrical connections to the electrical leads on both sides of the opto-electronic package from below the frame.

15. An opto-electronic package manipulation system as claimed in claim 10, further comprising standoffs for engaging another pallet to enable stacking of multiple pallets on top of each other.

* * * * *